United States Patent [19]

Judy

[11] 4,456,943
[45] Jun. 26, 1984

[54] CURRENT SENSING RELAY

[75] Inventor: Murray S. Judy, Carlsbad, Calif.

[73] Assignee: GA Technologies Inc., San Diego, Calif.

[21] Appl. No.: 381,047

[22] Filed: May 24, 1982

[51] Int. Cl.³ .............................................. H02H 3/26
[52] U.S. Cl. .................................. 361/160; 307/116; 307/309; 361/187
[58] Field of Search ....................... 361/160, 187, 197; 307/116, 309; 323/368

[56] References Cited

U.S. PATENT DOCUMENTS

| | | | |
|---|---|---|---|
| 3,419,791 | 12/1968 | Mishkousky | 361/187 X |
| 3,490,035 | 1/1970 | Hart et al. | 307/309 X |
| 3,519,899 | 7/1970 | Yamada | 307/309 X |
| 3,621,334 | 11/1971 | Burns et al. | 307/309 X |
| 3,652,878 | 3/1972 | Schmidt | 307/309 |
| 3,660,695 | 5/1972 | Schmitt | 307/309 |
| 3,894,250 | 7/1975 | Hager et al. | 307/309 |
| 3,923,030 | 12/1975 | Luteron | 307/309 X |
| 4,138,641 | 2/1979 | Karlin et al. | 324/117 X |
| 4,156,820 | 5/1979 | Fukuda | 307/309 |
| 4,163,160 | 7/1979 | Frazee | 307/309 X |
| 4,199,696 | 4/1980 | Tanaka et al. | 307/309 |
| 4,218,626 | 8/1980 | Fukuda et al. | 307/116 |
| 4,283,643 | 8/1981 | Levin | 324/117 X |
| 4,291,356 | 9/1981 | Mathieu | 361/187 X |

Primary Examiner—George H. Miller, Jr.
Assistant Examiner—Derek S. Jennings
Attorney, Agent, or Firm—Fitch, Even, Tabin & Flannery

[57] ABSTRACT

A current sensing relay assembly is disclosed wherein current sensing devices are integrated with relay outputs on a single printed circuit assembly. By integrating the output and sensor, all additional external equipment and wiring are eliminated. The current sensors achieve a maximum current to minimum current sensing ratio exceeding 100 by sensing current flow magnetically using Hall-effect devices and appropriate amplifier circuitry. Multiple channels of current sensing are achieved without requiring individual sensitivity adjustments by utilizing common threshold references for all channels. The electronic portion of the sensor achieves immunity from power line noise and a stable sensing threshold by a combination of circuit design and layout. In the illustrated embodiment, the magnetic portion of the sensor is contained entirely in a single module that incorporates the sensing coil, magnetic circuit, Hall-effect sensor, and magnetic shield.

10 Claims, 19 Drawing Figures

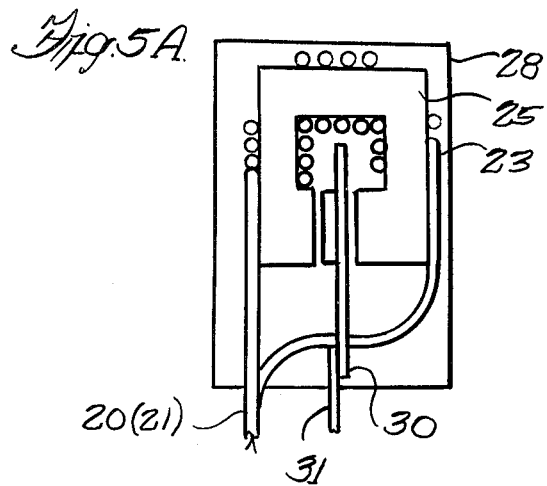
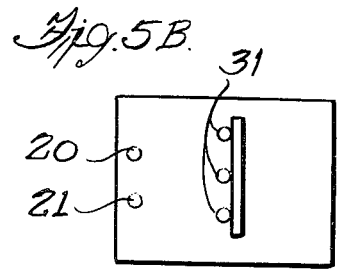
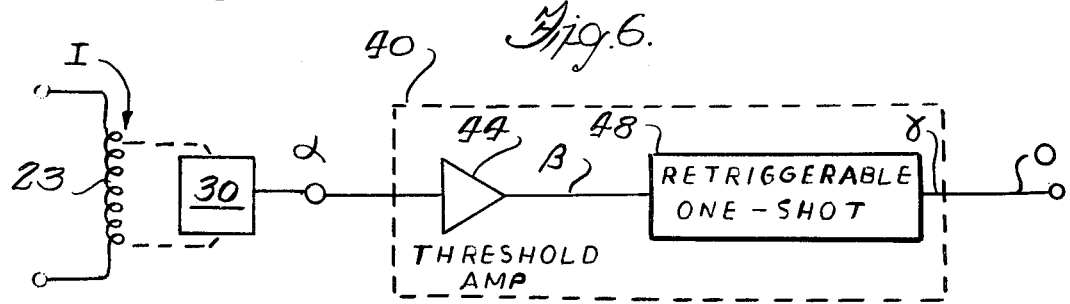
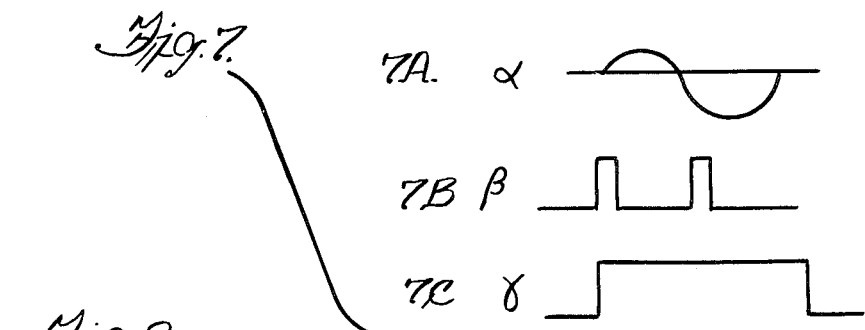
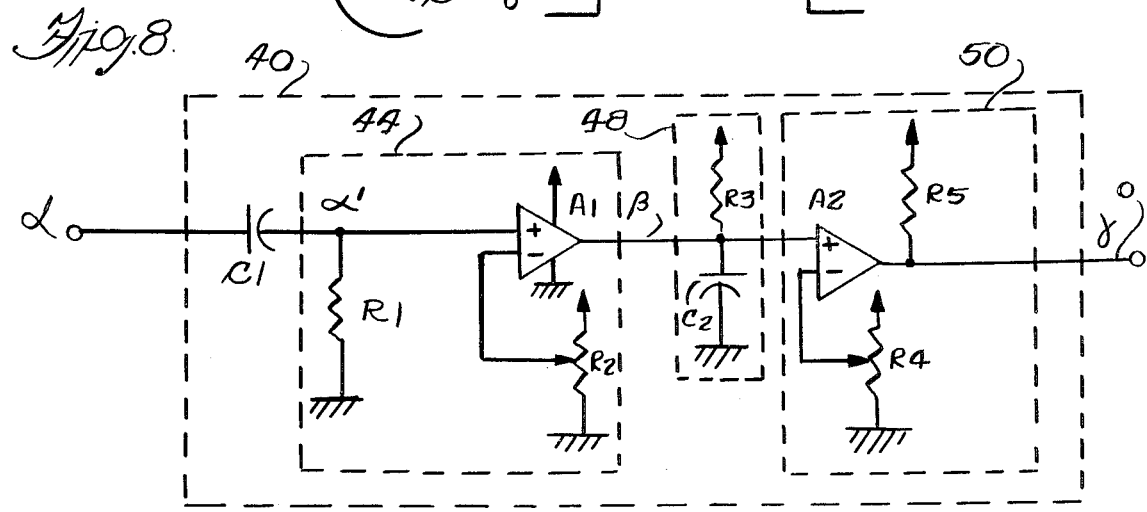

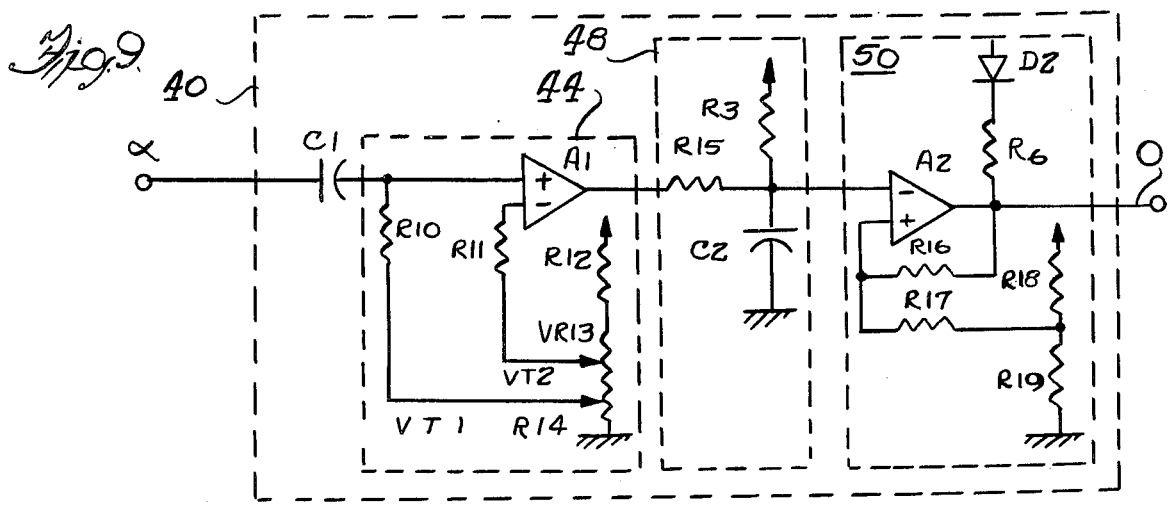
Fig. 9
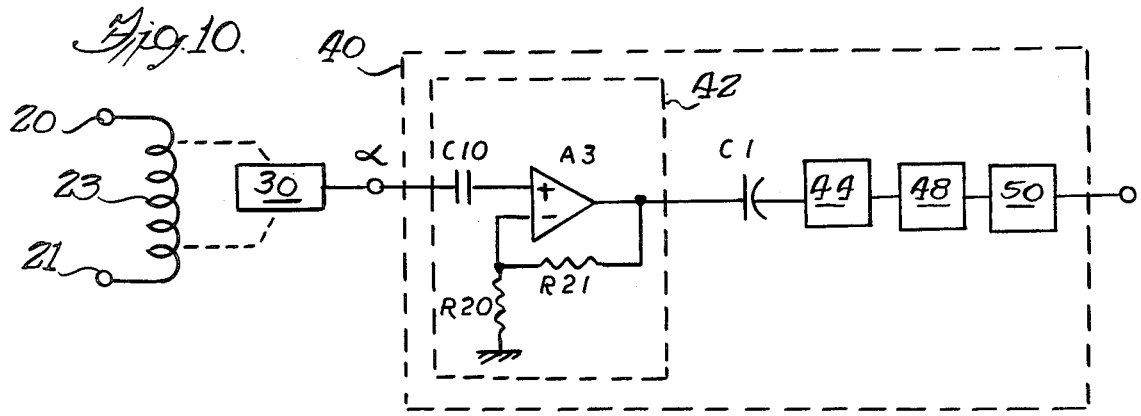
Fig. 10
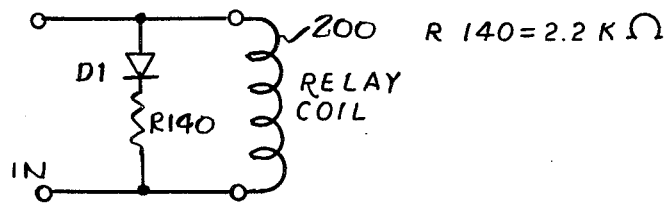
Fig. 12A. RELAY CONTROL CIRCUITRY
R 140 = 2.2 KΩ
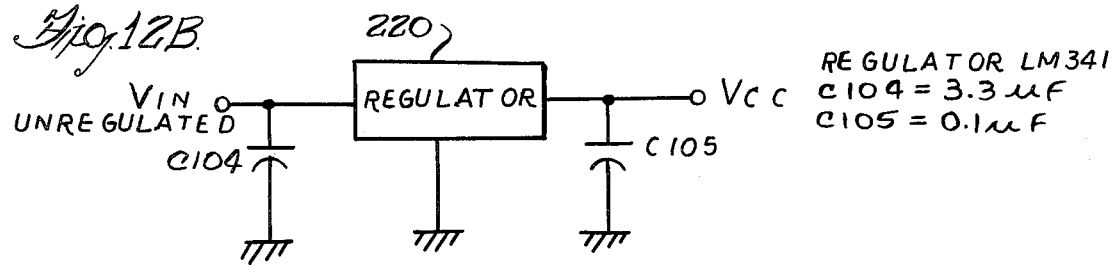
Fig. 12B.
REGULATOR LM341
C104 = 3.3 μF
C105 = 0.1 μF

CURRENT SENSING RELAY

This invention relates to remote device operation sensing and more particularly to a current sensing relay.

In many applications, it is useful to know when an external device is operating. This knowledge can be used directly to sense malfunctions or can be used with an independent sensor to better determine the exact state of a process being controlled or monitored. Computerized process control and security systems operate external devices, typically, by closing contacts to supply power to the device. For example, in a computerized system for automation of bulk petroleum distribution terminals, when the system grants a truck driver access to load a product, the system closes relay contacts in a valve permissive circuit. This circuit consists of several series connected contacts and a solenoid operated valve. The valve opens only when all the contacts are closed. Considerable time may elapse from the time the system permits valve operation until the last contact closes and the valve opens. For many reasons, including security, it is desirable for the system to know when the valve actually opens. There are a number of ways to sense valve operation. Switches can be installed on the valve to detect motion of the operators. Flow sensing devices can be installed in the piping. A relay may be installed to sense energization of the valve solenoid (voltage sensing). Each of these methods requires installation of additional wiring between the sensing device and the control equipment. For existing petroleum distribution terminals, this extra equipment and wiring is both expensive and disruptive to ongoing operations.

Operation of the valve solenoid can also be detected by sensing the flow of current in the circuit supplying power to the valve solenoid. This method has the advantage of remote sensing without installation of additional field wiring or field equipment. Existing current sensors have a number of disadvantages. One problem is the small operating-to-sensing current ratio of existing sensors. The operating-to-sensing current ratio is the ratio of the maximum operating current to the minimum sensing current. In the system example as discussed above, maximum operating currents go to 5 amperes and minimum sensing currents are about 100 milliamperes, resulting in a desired ratio of 50. However, existing sensors have a ratio in the range of 10 to 20. This would require several different types of existing sensors to provide coverage of the desired range of 50. Another disadvantage of eixsting current sensors is their availability in single channel units only. Because of the large number of valves typically being controlled (20 to 40 typically), these single channel sensors would have to be grouped and mounted together in a large enclosure, and each channel would have to be individually wired and adjusted. Further problems include power line noise susceptibility, and stability of sensing threshold.

In accordance with one embodiment of the present invention, current sensing devices are integrated with relay outputs on a single printed circuit assembly. By integrating the output and sensor, all additional external equipment and wiring are eliminated. The current sensors achieve a maximum current to minimum current sensing ratio of at least 100 by sensing current flow magnetically using Hall-effect devices. Multiple channels of current sensing are achieved without requiring individual sensitivity adjustments. The electronic portion of the sensor achieves immunity from power line noise and a stable sensing threshold by a combination of circuit design and layout. In the illustrated embodiment, the magnetic portion of the sensor is contained entirely in a single module that incorporates the sensing coil, magnetic circuit, Hall-effect sensor and magnetic shield. This construction allows high density packaging utilizing conventional printed circuit boards.

The present invention can be better understood by reference to the detailed description of the drawings illustrating various aspects of the present invention, wherein.

Figure 1:
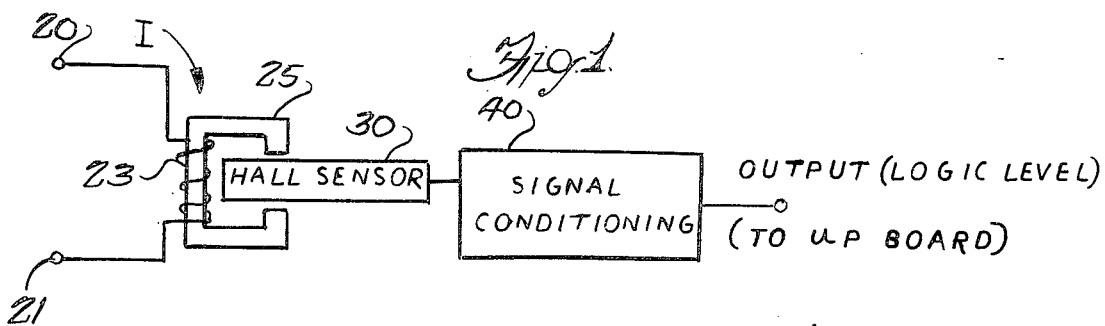
FIG. 1 is a schematic of the current sensing circuitry illustrating one embodiment of the present invention.
Figure 4A:
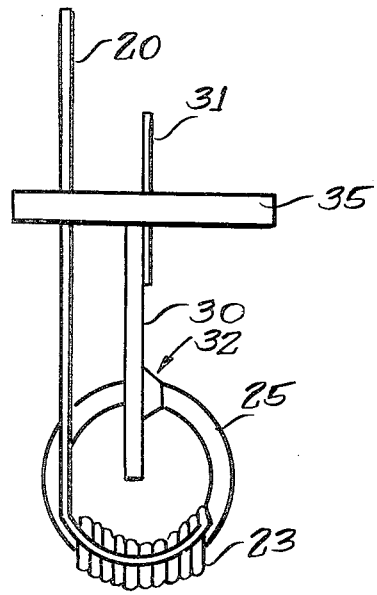
Figure 4C:
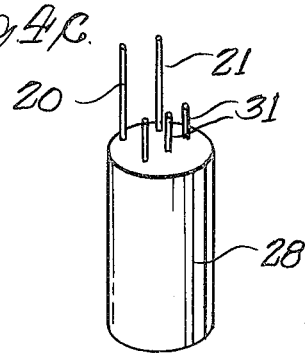
Figure 4B:
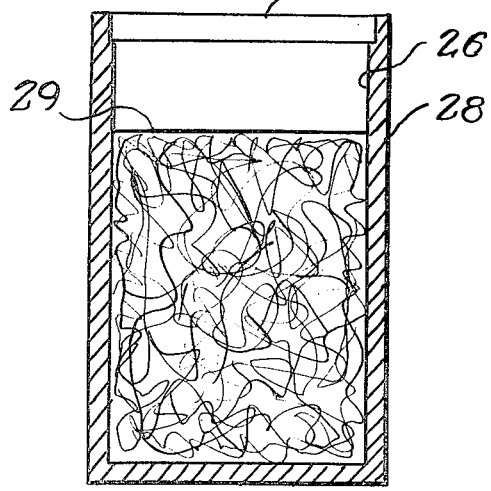
Figure 11:
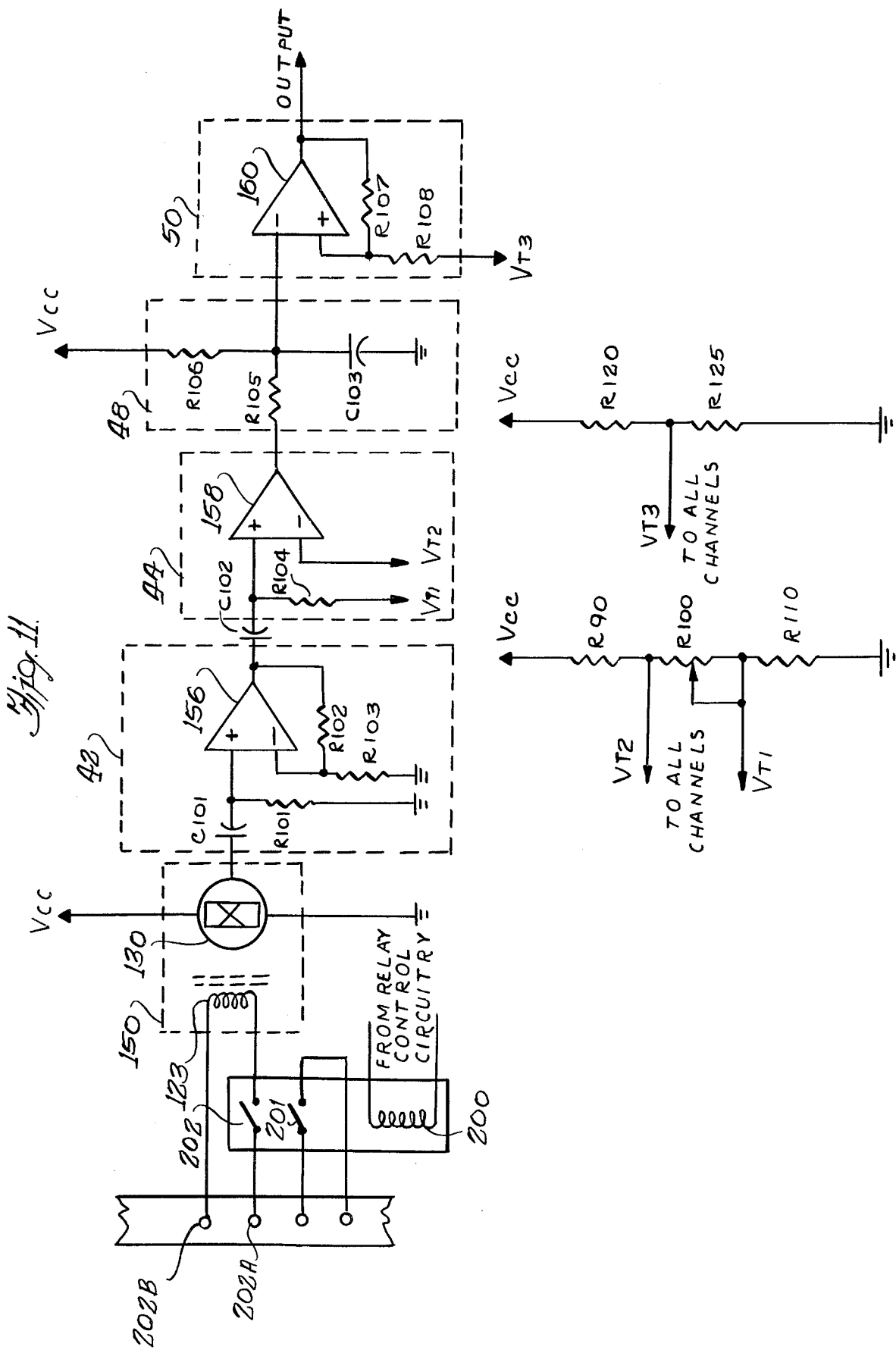

FIGS. 4A-4C illustrate one embodiment of a sensor assembly according to the present invention, wherein FIG. 4A is a side view illustrating component interconnection and placement, FIG. 4B is a side view of the sensor assembly illustrating the potting shell, magnetic shielding, and potting compound as utilized in the sensor assembly, and FIG. 4C is a perspective view illustrating the completed sensor assembly including external connectors;

FIGS. 5A-5B illustrate an alternate embodiment of the sensor assembly of FIGS. 4A-4C, wherein a C-core is utilized in place of the toroidal core of FIG. 4A, FIG. 5A illustrating a side view, and FIG. 5B illustrating a bottom view showing external connector positioning;

FIG. 6 is an electrical schematic illustrating a first detailed embodiment of the signal conditioning circuitry 40 of FIG. 1;

FIGS. 7A-7C illustrate signal waveforms at corresponding designated points $\alpha$, $\beta$, and $\gamma$, of FIG. 6;

FIGS. 8-10 are alternate detailed embodiments of the signal conditioning circuitry 40 as illustrated in FIGS. 1 and 6, illustrating various enhancements and improvements of alternate embodiments of the signal conditioning circuitry;

FIG. 11 is a detailed electrical schematic illustrating a preferred embodiment of current sensing circuitry as utilized in accordance with the present invention; and FIGS. 12A-12B illustrate additional electronic circuitry which can be utilized in conjunction with the circuitry of FIG. 11.

Referring now to FIG. 1, a sensing coil 23 is coupled in series via connectors 20 and 21 between the relay contacts output and the switched load. When the contacts of the relay close, thereby activating the load, a current I flows through the sensing coil. The sensing coil 23 is wrapped around a magnetic coupling core 25 having a slot opening therein. A Hall-effect sensing device 30 is positioned within the slot opening of the core 25. When the current I flows through the sensing coil 23, a magnetic field is induced in the core 25, and is sensed by the Hall-effect sensing device. The Hall-effect sensing device 30 outputs a low level AC signal responsive to, and proportional to the strength of, the detected magnetic field. The output of the Hall-effect sensing device 30 is coupled to signal conditioning circuitry 40 which processes the low level AC signal and provides a logic level output. The logic level output may be coupled to other circuitry, such as a microprocessor board. The utilization of magnetic coupling provides isolation of the electronics of the signal conditioning circuitry 40 (and circuitry coupled thereto) from power line noise. Current capacity is constrained only by the size of the sensing coil, which can be made as thick or thin as necessary, with as many turns as are needed for the desired operational effects.

Figure 2:
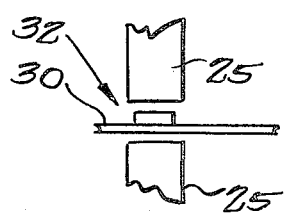
FIG. 2 is a side view illustrating positioning of the Hall-effect sensor relative to a slotted core.

Referring to FIG. 2, the details of the physical placement of the Hall-effect sensing device 30 relative to the slot of the magnetic coupling core 25 is illustrated. The Hall-effect sensor 32 of the Hall-effect device 30 is shown positioned in the center of the slot opening of the core 25, both vertically and horizontally. However, other placements of the sensor 32 relative to the slot opening are acceptable so long as the Hall-effect device 30 provides a signal output for desired ranges of magnetic field (current) sensing. Additionally, the magnetic circuitry 25 can be implemented with other magnetic coupling means in addition to the illustrated cores. The Hall-effect device 30 includes the Hall-effect sensor 32, and can include other on-chip circuitry, such as buffer amplifiers.

Figure 3B:
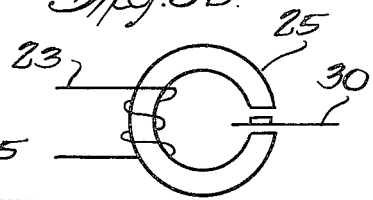
FIGS. 3A-3B illustrate C-core and toroidal embodiments illustrating the present invention showing relative positioning of the Hall-effect sensor in the slotted portion of the respective core for sensing induced magnetic fields.
Figure 3A:
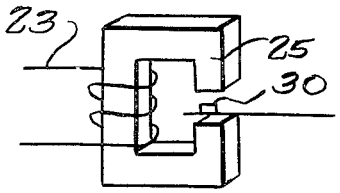

Referring to FIGS. 3A–3B, preferred magnetic coupling means are illustrated. Referring to FIG. 3A, a molded square core having a slotted opening so as to form a C is illustrated, showing relative placement of the Hall-effect sensing device 30 and the sensing coil 23 relative to the core 25. Referring to FIG. 3B, a slotted toroidal core 25 is shown with relative positioning of the Hall-effect sensing device 30 and sensing coil 23.

Referring to FIGS. 4A–4C, a sensor assembly utilizing a slotted toroidal core as shown in FIG. 3B is illustrated. Referring to FIG. 4A, the sensing coil 23 encircles a portion of the slotted toroidal core 25, with extensions of the sensing coil 23 passing through a cover assembly 35 of the sensor assembly module and providing external leads 20 (and 21 as shown in FIG. 4C). The Hall-effect sensing device 30 is positioned such that the Hall-effect sensor 32 is oriented as shown in FIGS. 2–3. Output leads 31 extend from the Hall-effect sensor 30 through the cover 35 to provide external connections designated 31.

Referring to FIG. 4B, the external covering of the sensor assembly of FIG. 4A is illustrated. A potting shell 28 is filled partially with a potting compound 29 so as to encapsulate the core 25, sensing coil 23, and Hall-effect sensor 32. Magnetic shielding 26 is provided to isolate the sensor assembly contents from adjacent sensor assemblies and other circuitry. The cover 35 seats in the potting shell 28 as illustrated.

Referring to FIG. 4C, a completed sensor assembly is illustrated, and shows the extension of external connections 20, 21, and 31, for coupling to circuitry outside the sensor aassembly.

Referring to FIGS. 5A–5B, an alternate embodiment of the sensor assembly of FIGS. 4A–4C is shown, illustrating the utilization of a molded C-core consistent with FIGS. 2 and 3A. The core 25, sensing coil 23, and Hall-effect sensor device 30 are encapsulated within the shell 28, in a manner as described with reference to FIGS. 4A–4C, and external connections 20, 21, and 31 are provided for coupling to external circuitry. Referring to FIG. 5B, a bottom view of the assembly of FIG. 5A is shown, illustrating the positioning of the external connection points 20, 21, and 31. In a preferred embodiment, the core 25, of both FIGS. 4 and 5, is of a ferrite material, though other materials can be utilized. In one embodiment of FIG. 5A, where a ferrite core 25 is utilized, and 10 turns of 18 AWG are utilized for the sensing coil 23 (being approximately 8 inches in length including leads), an effective resistance of 4.41 milliohms is effectively added by the sensing coil. In this embodiment, the sensor assembly dissipates only 0.11 watts for a sensed current level of 5 amperes. This low power is desirable, especially in a closed (nonvented) module, so as to limit heat dissipation in the sensor assembly.

Referring to FIG. 6, a more detailed diagram of FIG. 1 is illustrated, expanding the signal conditioning circuitry 40. When a load current I passes through the sensing coil 23 an output alpha is generated from the Hall-effect sensing device 30. This output, designated $\alpha$, is a low level AC signal, as illustrated at FIG. 7A. The output is coupled to the input of signal conditioning circuitry 40 which processes the input signal to provide a logic level output designated gamma, $\gamma$, as illustrated at FIG. 7C. The signal conditioning circuitry 40 is shown comprised of a threshold amplifier 44 and a retriggerable one-shot designated 48. The Hall-effect output $\alpha$ is coupled to the input of the threshold amplifier 44 to provide an output beta ($\beta$), as shown in FIG. 7B. The output $\beta$ is a pulsed output which triggers the input of retriggerable one-shot 48. If the induced Hall-effect sensing device output, $\alpha$, is below a minimum threshold, the threshold amplifier 44 will cease producing pulses, thereby causing the output of retriggerable one-shot 48 to go to an inactive signal level. When the output is greater than a high sensing level, as determined relative to the threshold amplifier 44, the output $\beta$ is a pulse train periodically repeating, so as to retrigger one-shot 48 to provide a logic level output $\gamma$.

Referring to FIG. 7, signal waveforms are illustrated for outputs $\alpha$, $\beta$ and $\gamma$ of FIG. 6.

Referring to FIG. 8, an alternate embodiment of the signal conditioning circuitry 40 of FIGS. 1 and 6 is shown. Since the amplifiers and comparators utilized in a production system are commercial devices, having nonideal constraints and characteristics, additional signal conditioning circuitry should be added to compensate for practical problem areas. In a simple implementation of the signal conditioning circuitry of FIG. 6, the Hall-effect sensor output $\alpha$ is AC coupled via capacitor C1, and filtered via capacitor C1 and resistor R1, prior to input to the threshold amplifier A1. The threshold amplifier A1 compares the filtered signal, $\alpha'$, to a threshold level as determined by the setting of potentiometer R2. The output of the threshold amplifier, $\beta$, couples to the monostable timing network, R3 and C2, as illustrated. The center point between R3 and C2 is coupled to an amplifier-level detector A2 which implements logic level switching and buffering functions. The threshold of amplifier A2 is set by potentiometer R4. Resistor R5 provides high logic level voltage pull-up to speed switching from low to high level. In one practical embodiment of FIG. 8, C1 and C2 each equal 0.1 microfarad, R1 and R5 each equal 100 kilohms, R2 and R4 each equal 500 kilohms, R3 equals 1 megohm, and amplifiers A1 and A2 are commercially available LM339. This circuit can exhibit noise sensitivity, and at certain threshold settings (e.g., 100 mA sense level) of amplifier A1 the circuitry may not switch cleanly. Thus, it is desirable to provide a circuit which can be practically implemented yet avoid practical problems under all foreseeable operating conditions.

Referring to FIG. 9, an alternate embodiment of the signal conditioning circuitry 40 of FIG. 8 is illustrated, employing circuitry to overcome the practical problems to which FIG. 8 is susceptible. Protection against negative input voltage excursions beyond the maximum rating of the amplifiers is accomplished by utilization of resistors R10, R12, VR13, and R14. The divider R12, VR13, and R14 sets the DC potential of the input terminals of amplifier A1 at a value within the range of the amplifier A1. For example, where an LM339 is utilized, and R12 equals 1500 ohms, R13 equals 50 ohms, and R14 equals 600 ohms, the DC potential is set at approximately 1.4 volts DC. By setting the DC potential at the input terminals, the AC output of the sensor is prevented from driving the input terminals below ground, even at high levels of load current being sensed. Resistors R10 and R11 provide isolation when multiple channels share divider R12, VR13, and R14. Resistor R10 can alternatively be coupled to ground instead of to the resistive divider and resistor R11 can be replaced by a short circuit, in one embodiment. Noise sensitivity is reduced by the addition of resistor R15 in series with the output of amplifier A1 prior to coupling to the monostable multivibrator timing network. The addition of resistor R15 gives the circuit a turn on and a turn off delay by affecting the charge and discharge time constants. Positive feedback is added to amplifier A2, by resistor R16, to prevent oscillation of amplifier A2 at its threshold point as set by resistors R18 and R19. These changes, from FIG. 8 to FIG. 9, correct the problems experienced in practical implementation of this embodiment of FIG. 8. However, testing of multiple samples of commercially available integrated circuit (IC) comparators and amplifiers showed that a greater than 50% variation in threshold points existed between IC's as IC's were interchanged. For example, in an embodiment of FIG. 9 utilizing LM339 comparator integrated circuit samples, variations of input offset voltage, specified at plus and minus 5 millivolts, were determined to be a problem since the input voltage to the threshold detector from the Hall-effect device was about 10 millivolts peak at a current threshold of a 100 milliamps. Thus, the threshold detector must be nulled to eliminate the variation in input offset. However, where a plurality of channels are utilized, each having current sensing circuitry in accordance with the present invention, individual channel adjustments of input offset voltage would be expensive and require a great deal of labor. Alternatively, a more expensive threshold comparator could be utilized having smaller input offset voltage specifications. However, both of these alternatives are undesirable in terms of expense. A third alternative would be to increase the signal level prior to application of the Hall-effect device output to the threshold detector. This could be implemented utilizing inexpensive circuitry, and could eliminate the need for input offset adjustment, thereby making multiple channel systems feasible and practical.

Referring to FIG. 10, the system of FIG. 9 has been expanded to add an AC preamplifier designated 42. The output from the Hall-effect sensor 30 is AC coupled via capacitor C10 to the preamplifier A3, illustrated in a noninverting amplifying configuration. The output of the preamplifier 42 is AC coupled via capacitor C1 to the threshold detecting circuitry 44, and therefrom to the retriggerable one shot circuitry 48 and buffer amplifier circuitry 50, as described above with reference to FIG. 9. In one embodiment of FIG. 10, the amplifier A3 is an LM324 integrated circuit, with resistor R20 equal to 39 kilohms, resistor R21 equal to 1 megohm, and input capacitor C10 equal to 0.001 microfarad. In this configuration, the preamplifier circuitry 42 provides a gain of 25. Thus, at a sensing threshold of 100 milliamperes, the threshold detector is provided with a 250 millivolt signal (10 millivolts times 25). If the threshold detector has a plus and minus 5 millivolt offset variation, the threshold variation due to this offset variation equals plus and minus 5 divided by 250, equals plus and minus 2%. This is opposed to the plus and minus 50% variation which results without utilization of the preamplifier. Thus, the practical problem of device to device input offset variation has been eliminated.

Referring to FIG. 11, a detailed electrical diagram of a current sensing system schematic is shown illustrating a preferred embodiment of the present invention. When a relay coil 200 is energized, contacts 201 and 202 are closed, coupling respective connector points on a barrier strip which couple to external circuitry, such as a valve solenoid. As illustrated, when the contact 202 closes, the load current passing between terminals 202A and 202B of the barrier strip pass through sensing coil 123 of the sensor assembly 150. The Hall-effect sensing device 130 within the sensor assembly 150 is positioned as described above with reference to FIGS. 2–5. When the load current passing through the sensing coil 123 induces a sufficient magnetic field to actuate the Hall-effect device 130, an output signal is provided from the sensor assembly 150, and is AC coupled via capacitor C101 to preamplifier 156. The preamplifier circuitry designated 42 corresponds to the circuitry described with reference to FIG. 10, with capacitor C101 corresponding to C10, R102 corresponding to R21, and R103 corresponding to R20. Resistor R101 provides an additional level of filtering. The output of preamplifier 42 is AC coupled via capacitor C102 to the threshold amplifier circuitry 44, corresponding to threshold amplifier circuitry 44 of FIGS. 8 and 9. A single resistive divider network comprising R90, R100 and R110 provide the VT1 and VT2 threshold level signals to the threshold detection circuitry 44 of all channels (all sensor assemblies). The output of the comparator 158 of the threshold detection circuitry 44 is coupled to the monostable multivibrator timing circuitry 48, corresponding to circuitry 48 of FIGS. 8 and 9, with R106 corresponding to R3, C103 corresponding to C2, and R105 corresponding to R15 of FIG. 9. The output from the timing circuitry 48 is coupled to the inverting input of the output buffer amplifier 50 comprising comparator 160 and resistors R107 and R108 corresponding to amplifier A2 and resistors R16 and R17, respectively, of FIG. 9. A threshold signal level, VT3, for the buffer amplifier stage 50 is provided for all channels from a single source resistor divider network comprising R120 and R125. Alternatively, individual threshold setting circuitry could be provided for VT1, VT2, and VT3, for each of the channels of the system, if deemed desirable.

Referring to Table 1, exemplary values of resistors and capacitors and integrated circuits for the system of FIG. 11 are shown for a practically functional embodiment of the present invention.

Referring to FIGS. 12A–12B, additional electrical circuitry utilized in conjunction with the system of FIG. 11 is shown. Referring to FIG. 12A, the relay control circuitry which actuates the relay coil 200, coupled to the relay coil 200, is shown as comprising resistor R140 and diode D1, which provide current level and inductive kickback protection, respectively, for the actuating circuitry. Referring to FIG. 12B, a voltage regulator circuit is shown for providing a regulated VCC voltage output from an unregulated voltage input. The voltge regulator circuit is comprised of input filter capacitor C104, voltage regulator 220, and output filter capacitor C105. Examplary values for component values for a practical functional embodiment of FIGS. 12A and 12B are R140 equals 2.2 kilohms, 220 is an LM341 integrated circuit amplifier, C104 equals 3.3 microfarads, and C105 equals 0.1 microfarads.

While there have been described above various embodiments of currenting sensing relay systems, for the purpose of illustrating the manner in which the invention may be used to advantage, it will be appreciated that the invention is not limited thereto. Accordingly, any modification, variation, or equivalent arrangement within the scope of the accompanying claims should be considered to be within the scope of the invention.

TABLE 1

Exemplary Values for FIG. 11

| | | |
|---|---|---|
| R101 | 1M | 156 = LM324 |
| R102 | 1M | 158 = LM339 |
| R103 | 39K | 160 = LM339 |
| R104 | 270K | |
| R105 | 390K | |
| R106 | 1M | |
| R107 | 1M | |
| R108 | 30K | |
| R90 | 10K | |
| R100 | 5K potentiometer | |
| R110 | 5K | |
| R120 | 3.6K | |
| R125 | 2.0K | |
| C101 .001uf | | |
| C1020 .1uf | | |
| C103 0.1uf | | |

What is claimed is:

1. An integral relay system comprising:
  a relay assembly comprising contacts having open and closed positions for selectively providing an output depending upon whether said contacts are open or closed, and a coil responsive to an input for selectively operating said contacts;
  a winding in series with the output from the contacts;
  a Hall-effect device proximately located relative to said winding and responsive to the magnetic field produced by the respective winding for providing an electrical output systematically related to said magnetic field; and
  processing means responsive to said electrical output of said Hall-effect device for providing an output signal indicative of whether said contacts are open or closed.

2. The system as in Claim 1 further comprising a plurality of individual relay assemblies, housed in an integral assembly forming a multi-channel relay system.

3. The system as in claim 2 wherein each individual relay assembly functions independently.

4. The system as in claim 1 further comprising:
  means for amplifying said electrical output and providing an amplifier output prior to coupling to said processing means.

5. The system as in claim 4 further comprising:
  means for selectively outputting a binary logic level signal responsive to detection of said amplifier output above a predetermined threshold level.

6. The system as in claim 3 further comprising:
  means for amplifying said electrical output prior to coupling to said processing means.

7. The system as in claim 6 further comprising:
  means for selectively outputting a binary logic level signal responsive to detection of said amplifier output above a predetermined threshold level.

8. The system as in claim 7 wherein a common threshold level is provided to all channels.

9. A current sensing relay system comprising:
  a relay having a set of contacts,
  a sensor assembly coupled to said contacts comprising:
  a sensing coil coupled to said contacts and wound about a slotted core,
  Hall-effect sensing means positioned within the core for providing a signal output responsive to a magnetic field induced in the core by said sensing coil, and
  means for providing a logic level signal output responsive to the Hall-effect signal output.

10. The system as in claim 9 further comprising:
  a magnetic shield enclosing said sensor assembly.

* * * * *